United States Patent
Bohlmann et al.

(10) Patent No.: US 7,906,888 B2
(45) Date of Patent: Mar. 15, 2011

(54) ACTUATOR FOR ACTUATING A FUEL INJECTION VALVE

(75) Inventors: Tim Bohlmann, Zeitlarn (DE); Michael Denzler, Regensburg (DE); Stefan Kohn, Hohenburg (DE); Klaus Plecher, Zeitlarn (DE); Andreas Voigt, Burglengenfeld (DE); Claus Zumstrull, Regenstauf (DE)

(73) Assignee: Continental Automotive GmbH, Hannover (DE)

( * ) Notice: Subject to any disclaimer, the term of this patent is extended or adjusted under 35 U.S.C. 154(b) by 211 days.

(21) Appl. No.: 11/813,340

(22) PCT Filed: Nov. 25, 2005

(86) PCT No.: PCT/EP2005/056239
§ 371 (c)(1),
(2), (4) Date: Sep. 26, 2007

(87) PCT Pub. No.: WO2006/072509
PCT Pub. Date: Jul. 13, 2006

(65) Prior Publication Data
US 2008/0149070 A1 Jun. 26, 2008

(30) Foreign Application Priority Data
Jan. 7, 2005 (DE) .......... 10 2005 001 005

(51) Int. Cl.
*H01L 41/08* (2006.01)
(52) U.S. Cl. .......... 310/328; 310/344; 310/340
(58) Field of Classification Search .......... 310/328, 310/338, 340, 344, 348
See application file for complete search history.

(56) References Cited

U.S. PATENT DOCUMENTS

| 3,561,353 | A | * | 2/1971 | Curran | 101/65 |
| 5,875,764 | A |   | 3/1999 | Kappel et al. | 123/467 |
| 6,435,430 | B1 |   | 8/2002 | Ruehle et al. | 239/585.4 |
| 6,637,677 | B1 | * | 10/2003 | Ruehle et al. | 239/584 |
| 2006/0038031 | A1 |   | 2/2006 | Unruh | 239/102.2 |
| 2007/0277618 | A1 | * | 12/2007 | Kroeger et al. | 73/723 |

FOREIGN PATENT DOCUMENTS

| DE | 19844743 | 9/1998 |
| DE | 19858085 | 12/1998 |
| DE | 19940347 | 8/1999 |
| DE | 19956256 | 11/1999 |
| DE | 10007175 | 2/2000 |
| DE | 19912666 | 9/2000 |
| DE | 19925102 A1 | 12/2000 |
| DE | 10251225 | 11/2002 |
| DE | 10217594 | 11/2003 |
| DE | 102004039673 | 8/2004 |
| DE | 102004042352 | 9/2004 |
| EP | 0987428 A | 3/2000 |
| EP | 1628015 | 9/2004 |

OTHER PUBLICATIONS

International Search Report PCT/EP2005/056239, 6 pages.
Written Opinion of the International Search Authority (Supplementary Sheet) PCT/EP2005/056239, 1 page.

* cited by examiner

*Primary Examiner* — Mark Budd
(74) *Attorney, Agent, or Firm* — King & Spalding L.L.P.

(57) ABSTRACT

An actuator for actuating a fuel injection valve has a piezo-actuator, enclosed in an actuator housing unit (14, 16). The housing unit has a cylindrical actuator housing (14) which is elongate in its axial direction (A) and at least partially encased by an extruded plastic coat. The actuator housing unit (14, 16), in its encased area, is provided with a ventilation aperture (20) in which a ventilation element (22) produced from a microporous material is disposed.

17 Claims, 2 Drawing Sheets

ACTUATOR FOR ACTUATING A FUEL INJECTION VALVE

CROSS-REFERENCE TO RELATED APPLICATIONS

This application is a U.S. national stage application of International Application No. PCT/EP2005/056239 filed Nov. 25, 2005, which designates the United States of America, and claims priority to German application number 10 2005 001 005.9 filed Jan. 7, 2005, the contents of which are hereby incorporated by reference in their entirety.

TECHNICAL FIELD

The present invention relates to an actuator for actuating a fuel injection valve, in particular for use as a component of a fuel injector of an internal combustion engine.

BACKGROUND

An actuator of this type is known for example from DE 198 58 085 C1 and comprises an elongate piezoelectric actuator, the change in length of said actuator in the axial direction, which results with activation, being transmitted to a hydraulic servo valve of a fuel injector. For this purpose a base plate of the piezoactuator is actively connected via a lever transmission to an axially guided valve piston of the servo valve. The movement transmitted from the piezoactuator to the valve piston by means of the lever transmission is used in the fuel injector for opening and closing a fuel injection valve.

A fundamental advantage of use of a servo injection valve actuated by means of a piezoelectric actuator is that with a comparatively small stroke (in the µm range) of the piezoactuator an injection valve body stroke that is usually greater by a multiple can be attained independently thereof (hydraulic stroke transmission). In addition this results in the advantage that the movement of the injection valve body for opening and closing the injection passage is driven by the pressure of the fuel which is available anyway at a comparable pressure in the region of the injection valve for the purpose of injection into the combustion chamber. To activate the injection valve an actuator with a comparatively low stroke and comparatively low actuator force is therefore sufficient.

Actuators of this type have a limited life however. It has been found that this life depends on the installation environment of the actuator. In particular it should be assumed that with the presence of fuel such as diesel or petrol, or lubricants such as the engine oil of an internal combustion engine in the installation environment, the life is shortened owing to penetration of this "harmful" media into the housing interior.

SUMMARY

The life of an actuator can be improved by a An actuator for actuating a fuel injection valve, comprising a piezoactuator which is enclosed in an actuator housing unit having a cylindrical actuator housing which is elongate in an axial direction and at least partially encased by an extruded plastics material coat, wherein the actuator housing unit, in its encased region, is provided with a ventilation aperture in which a ventilation element produced from a microporous material is disposed.

BRIEF DESCRIPTION OF THE DRAWINGS

The invention will be described in more detail hereinafter with the aid of an exemplary embodiment and with reference to the accompanying drawings, in which:

FIG. 5 shows the actuator according to FIG. 3 after a ventilation element has been welded on.

DETAILED DESCRIPTION

Figure 1:
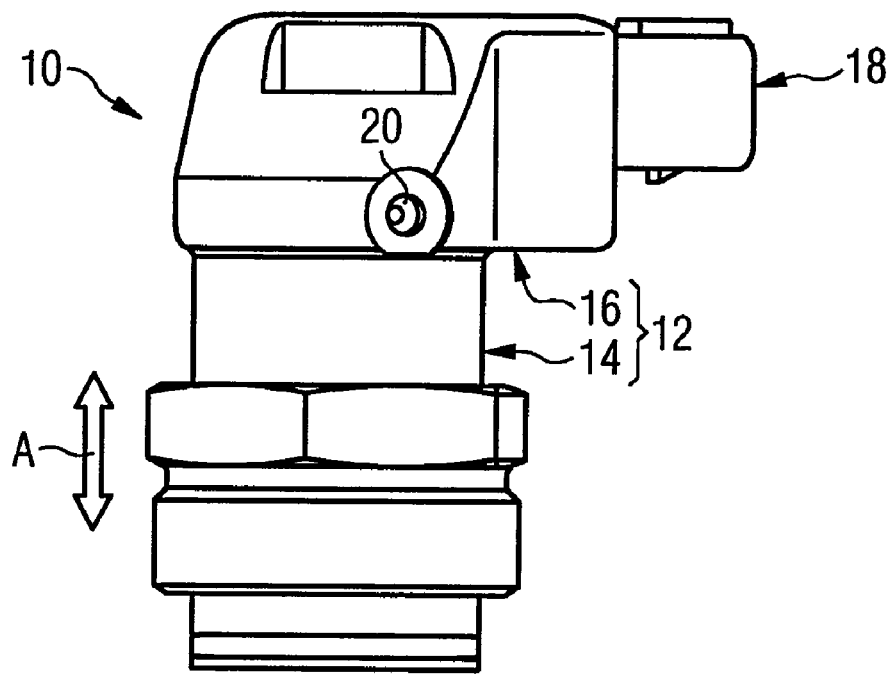
FIG. 1 shows a side view of an actuator in a stage of manufacture in which a ventilation opening is already formed but is not yet provided with fixtures.
Figure 2:
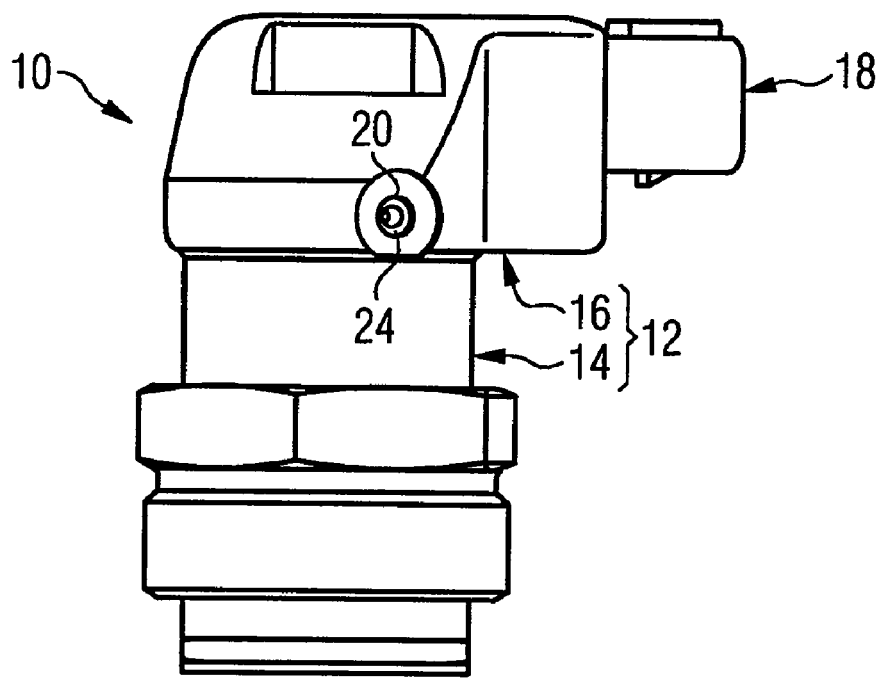
FIG. 2 shows the actuator from FIG. 1 after a sealing ring has been inserted into the ventilation opening.

With the actuator according to an embodiment the actuator housing unit, in its region encased by the extruded plastics material coat, is provided with a ventilation aperture in which a ventilation element produced from a microporous material is disposed. A ventilation passage that runs through the actuator housing unit is thereby created via which a pressure-equalizing exchange of gas is made possible between the actuator housing interior (actuator chamber) and the outer side of the actuator (installation environment or atmosphere).

In internal operational tests by the Applicants it has surprisingly been found that the arrangement of a piezoceramic component, like the piezoactuator that is of interest here, in an "optimally hermetically" sealed housing in an installation environment that exhibits harmful media in practice does not extend the life of the component but rather has a tendency to shorten it.

By contrast, according to an embodiment, a pressure-equalizing gas exchange connection between the housing interior and the atmosphere leads to a considerable lengthening of the life.

The mode of action of an embodiment is not entirely clear. One possible explanation is that with a housing that with an optimally hermetically sealed housing a vacuum is produced in the housing interior under certain operating conditions (for example as a result of temperature variations) by which harmful media can pass through the seal, which in practice cannot be constructed so as to be absolutely hermetic, into the housing interior. Other possible explanations exist for example in the fact that after a hermetically sealed actuator has been manufactured the concentration of any gas that shortens the life is increased or that a housing interior filling that resembles atmospheric air has a positive effect on the life.

In one embodiment it is provided that arranged in the cylindrical actuator housing is:

a top plate that is fixed in the axial direction and is provided with through-openings for the passage of contact pins of the piezoactuator, on which plate a first end of the piezoactuator is supported, the piezoactuator that acts in the axial direction, and a base plate that is movably guided in the axial direction and on which a second end of the piezoactuator is axially supported and can be actively connected to an actuator of the fuel injection valve.

The top plate can be accommodated on an axial end of the cylindrical housing and be welded or caulked thereto. Inside the actuator chamber and between the top plate and the base plate the piezoactuator can be held in an axially elongate Bourdon tube under axial compressive stress, the tube being welded at both its ends to the top plate and the base plate. The base plate can be configured as part of an active connection that acts in the direction of an actuator of the fuel injection valve. In this region the actuator chamber can be sealed in a manner known per se by a membrane that is welded between the inner wall of the cylindrical housing and the base plate.

The extruded plastics material coat may encase the cylindrical actuator housing not just in certain sections but it also may cover, preferably so as to be continuous in one piece, a connection-side end of the actuator housing unit.

With an extruded plastics material coat of this type that is known per se, for example the housing of a connector that can be used to electrically connect the actuator can be provided.

If, viewed over its length, the ventilation opening has a varying opening area, i.e. for example a taper and/or one or more step(s); this can be particularly advantageous for assembly or pressing of the ventilation element or a ventilation element and carrier part composite. In an embodiment it is provided that the opening area of the ventilation opening suddenly or discretely enlarges at a transition from the actuator housing to the extruded plastics material coat. The shoulder formed thereby within the ventilation opening may advantageously be used as an abutment face for the ventilation element or for additional components which are to be inserted into the ventilation opening from the outer side of the actuator housing unit. These additional components can for example be a sealing ring that will be described below or a ventilation element carrier that will be described below.

At least one sealing ring for annularly sealing a ventilation passage passing through the center of the ventilation opening and the ventilation element may be preferably arranged in the ventilation opening. A sealing ring of this type can for example rest on the material of the cylindrical actuator housing on the one hand and on the ventilation element, or a ventilation element carrier sealingly connected thereto on the other hand, so as to provide a seal.

If said sudden enlargement of the opening area at the transition from actuator housing to extruded plastics material coat is provided, the space created in the region of the extruded plastics material coat by the larger opening diameter can be used to receive a sealing ring of this kind which can then rest on the outer circumferential surface of the cylindrical actuator housing so as to provide a seal. On the other hand this sealing ring can then rest on the ventilation element, or a ventilation element carrier sealingly connected therewith, so as to provide a seal.

The sealing ring may be preferably pressed into the ventilation opening, for instance to improve the sealing effect thereof.

In one embodiment it is provided that the ventilation element is annularly connected to a cylindrical ventilation element carrier. A direct sealing connection may be achieved in this connection for example by welding or gluing. Use of a ventilation element carrier has two fundamental advantages: on the one hand mechanical loading of the ventilation element can be reduced or avoided thereby, and this is significant in particular with a mechanically sensitive and/or comparatively small or thin ventilation element. On the other hand the materials for the ventilation element and for the ventilation element carrier can be chosen independently of each other and thus optimized for their respective function.

The ventilation element may be preferably produced from ePTFE (expanded polytetrafluoroethylene). This material has proven to be very advantageous to thereby prevent "harmful media", such as fuel (diesel, petrol, etc.) or lubricants (for example engine oil) from penetrating into the actuator chamber and at the same time allowing volatile substances to migrate out of the actuator chamber and air or oxygen to migrate into the actuator chamber. Other microporous materials that can be used here are well known to a person skilled in the art and therefore do not require any further explanation.

The ventilation element can for example be of a substantially disc-shaped design (for example as a membrane). A ventilation disc or membrane of this type can be inserted into the ventilation opening for example through an interference fit that seals all the way round. Alternatively the ventilation element can be annularly connected to a cylindrical ventilation element, the external circumference thereof resting on the internal circumference of the ventilation opening so as to provide a seal.

According to an embodiment, a use of the actuator results for the piezoactuator of a fuel injector of an internal combustion engine in which the fuel injector and at least one additional component of a fuel injection device are arranged substantially completely inside a motor unit assembly of the internal combustion engine. This is taken to mean in particular the case in which components of the injection device are accommodated inside the motor unit assembly, which components, without restricting their function, could, also be arranged outside the motor unit assembly. The term "motor unit assembly" in this connection denotes all of the components that contain engine lubricating oil, i.e. the "motor unit" in the narrower sense and attachments (such as a cylinder head cover, etc.) into which the lubricating oil is pumped or lubricated or conveyed (back). With this type of engine construction there is an increased risk of "harmful media", such as oil and/or fuel entering into the interior of an injector housing or into the actuator chamber. These problems result for example in particular for diesel engines with a common rail system with injection components situated inside the cylinder head cover. A similar set of problems, namely the risk of water entering, also result with an injection device arranged outside of a motor unit assembly, for example with all-terrain vehicles, the engine thereof having to be operated partially or wholly under water for a short time.

FIG. 1 shows an actuator, designated as a whole by 10, for actuating a fuel injection valve (not shown). The actuator 10, together with this fuel injection valve, forms a fuel injector for an internal combustion engine and is used for controlled opening and closing of the injection valve connected to the actuator by a mechanical, active connection during operation of the internal combustion engine.

The actuator 10 comprises a piezoactuator (not shown) which is enclosed in an actuator housing unit 12 of which a cylindrical actuator housing 14 that is elongate in an axial direction A and made of metal (for example invar), and an extruded plastics material coat 16 can be seen in the figure.

The extruded plastics material coat 16 encases an upper (connection-side) region of the actuator housing 14 and at the same time forms an upper (connection-side) end of the actuator housing unit 12.

In a manner known per se the extruded plastics material coat 16 envelops what is known as a contact assembly arranged at the upper end of the actuator housing 14 and by means of which two contact pins of the piezoactuator that are guided through a sealed top arrangement are electrically connected to two connection pins of a connector 18. With the connector 18 the fuel injector can be connected for activation to an external cable assembly (for example cable harness in a motor vehicle). A, in FIG. 1 right-hand, section of the extruded plastics material coat 16 forms a housing for the connector 18 hereby.

As far as the inner construction of the actuator 10 or the fuel injector formed thereby is concerned, it is of a type known per se and is of subordinate importance within the scope of the invention. Reference is merely made by way of example to DE 199 56 256 B4 and DE 100 07 175 A1 with regard to the construction of the type of fuel injectors that are of interest here. One possibility for sealing the contact pins of the piezoactuator is described for example in DE 102 51 225 A1.

Reference is also made merely by way of example to DE 198 44 743 C1 and DE 199 40 347 A1 with regard to configuration of the contact assembly.

A characteristic feature of the illustrated actuator 10 is that the actuator housing unit 12 is provided in the encased region with a ventilation opening 20 in which a ventilation element 22 (FIG. 4) produced from microporous material is integrated in a manner that will be described below. The ventilation element is used in conjunction with the ventilation opening 20 to create a ventilation passage leading from the outside of the actuator 10 into the actuator chamber and through which an exchange of gas can take place, although liquids, such as engine oil are inhibited from penetrating into the actuator chamber.

The inner end of the ventilation opening 20 ends directly in the actuator chamber of the actuator 10 provided for receiving the piezoactuator.

The arrangement or integration of the ventilation element 22 during actuator assembly will be described hereinafter with reference to FIGS. 2 to 5.

Figure 4:
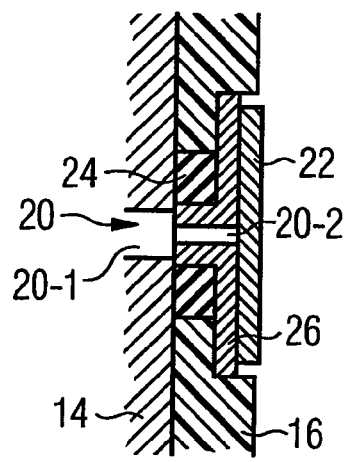
FIG. 4 is a section along the line IV/IV in FIG. 5.

It can be seen from the section in FIG. 4 that the opening area of the ventilation opening 20 suddenly or discretely increases at a transition from the actuator housing 14 to the extruded plastics material coat 16. In the region of the metal actuator housing 14 the ventilation opening 20 is formed as a hole 20-1 with a uniform and comparatively small diameter, while in the region of the extruded plastics material coat 16 the ventilation opening 20 is formed as a stepped hole 20-2 with comparatively large diameters, in which the hole diameter suddenly or discretely increases again toward the outside.

Starting form the situation shown in FIG. 1 a sealing ring 24 made of elastomer is first of all inserted from the outside into the ventilation opening 20, so it is received in the section with a smaller diameter of the stepped hole 20-2 and comes to rest on an outer circumferential surface of the actuator housing 14 around the outer mouth of the hole 20-1 (cf. FIG. 4).

Figure 3:
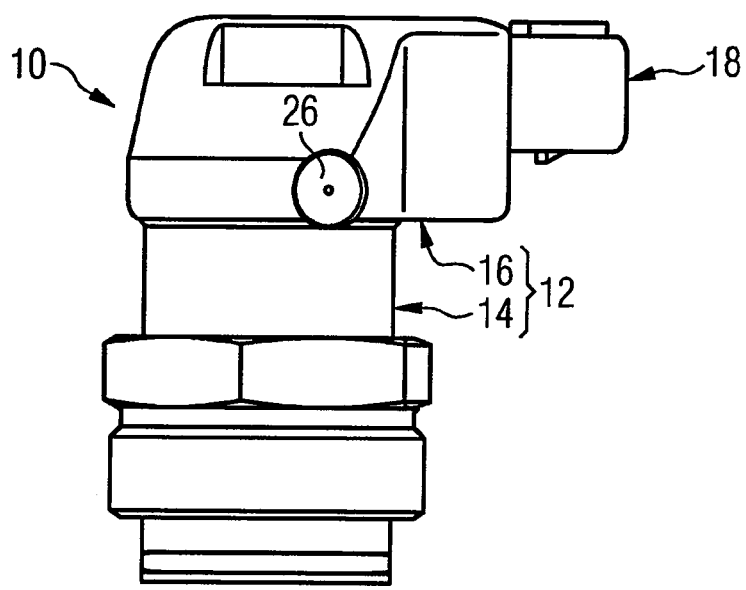
FIG. 3 shows the actuator according to FIG. 2 after a ventilation element carrier has been attached.

A cylindrical ventilation element carrier 26 produced from plastics material is then inserted into the ventilation opening 20 and circumferentially welded at its edge to the extruded plastics material coat 16. FIG. 3 shows this situation following insertion of the ventilation element carrier 26. The ventilation element carrier 26 has a disc-like section and an adjoining cylindrical section and, as can be seen in FIG. 4, is inserted with the cylindrical section at the front into the ventilation opening 20 in such a way that an external circumference of the cylindrical section comes to rest on an internal circumference of the sealing ring 24 so as to be sealed.

Figure 5:
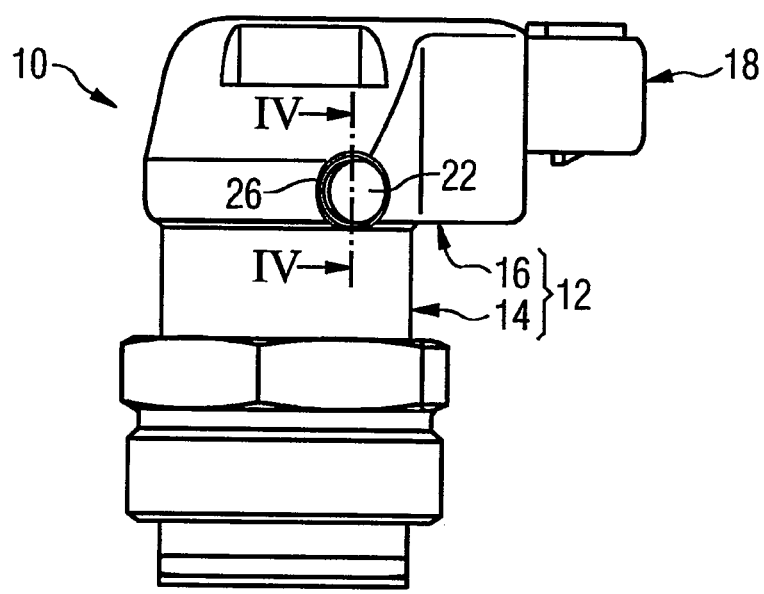

Finally the ventilation element 22 formed as a disc-shaped ePTFE membrane is placed onto the outer flat side of the ventilation element carrier 26 and circumferentially welded at its edge to the ventilation element carrier 26. FIGS. 4 and 5 show the situation after the ventilation element 22 has been attached.

Preferably and in contrast to the illustrated exemplary embodiment a prefabricated assembly of ventilation element and ventilation element carrier may be pre-fabricated and inserted as a whole into the ventilation opening.

In the finished state according to FIGS. 4 and 5 runs a ventilation passage that passes through the centre of the ventilation opening 20 and the ventilation element 22 and which is annularly sealed by the sealing ring 24 and the welding between the ventilation element 22 and the ventilation element carrier 26. The ventilation element carrier 26 connected to the plastics material by a welding (or for example gluing) hereby presses the sealing ring 24 against the outer side of the actuator housing 14, so the sealing ring 24 is jammed between the actuator housing 14 and the ventilation element carrier 26.

As a result there is also close abutment of the sealing ring material on the outer circumference of the cylindrical section and/or on the inner flat side of the disc-shaped section of the ventilation element carrier 26. In the illustrated exemplary embodiment sealing abutment of the sealing ring 24 on the cylindrical section of the ventilation element carrier 26 takes place by way of a suitably dimensioned interference fit between sealing ring 24 and ventilation element carrier 26 which is merely intensified by the pressure load.

In contrast to the illustrated exemplary embodiment it is conceivable to provide a plurality of ventilation openings each with a ventilation element integrated therein. Modifications to the components used in the ventilation opening are also possible. For example a ventilation element could be jammed between two sealing rings of the described type or the connection between the ventilation element carrier and the extruded plastics material coat can be achieved by a catch.

What is claimed is:

1. An actuator for actuating a fuel injection valve, comprising a piezoactuator which is enclosed in an actuator housing unit having a cylindrical actuator housing which is elongate in an axial direction and at least partially encased by a coating layer formed of an extruded plastics material, wherein the actuator housing unit, in its encased region, is provided with a ventilation aperture in which a ventilation element produced from a microporous material is disposed, the ventilation aperture extending through a wall of the actuator housing and through the coating layer.

2. The actuator as claimed in claim 1, wherein arranged in the cylindrical actuator housing is:
    a top plate that is fixed in the axial direction, wherein the top plate is provided with through-openings for the passage of contact pins of the piezoactuator, on which plate a first end of the piezoactuator is supported,
    the piezoactuator that acts in the axial direction, and
    a base plate that is movably guided in the axial direction and on which a second end of the piezoactuator is axially supported and can be actively connected to an actuator of the fuel injection valve.

3. The actuator as claimed in claim 1, wherein the extruded plastics material coating lay covers or forms a connection-side end of the actuator housing unit.

4. The actuator as claimed in claim 1, wherein the opening area of the ventilation opening suddenly enlarges at a transition from the actuator housing to the extruded plastics material coating layer.

5. The actuator as claimed in claim 1, wherein at least one sealing ring is arranged in the ventilation opening for annular sealing of a ventilation passage that passes through the center of the ventilation opening and the ventilation element.

6. The actuator as claimed in claim 5, wherein the sealing ring is pressed into the ventilation opening.

7. The actuator as claimed in claim 1, wherein the ventilation element is annularly connected to a cylindrical ventilation element carrier.

8. The actuator as claimed in claim 1, wherein the ventilation element is produced from ePTFE.

9. An actuator for actuating a fuel injection valve, comprising a piezoactuator enclosed in a cylindrical actuator housing which is elongate in an axial direction and at least partially encased by a coating layer formed of an extruded plastics material, wherein the cylindrical actuator housing, in its encased region, is provided with a ventilation aperture in which a ventilation element produced from a microporous material is disposed, the ventilation aperture extending through a wall of the actuator housing and through the coating layer.

10. The actuator as claimed in claim 9, wherein the cylindrical actuator housing comprises:
- a top plate fixed in the axial direction and provided with through-openings for the passage of contact pins of the piezoactuator, wherein the piezoactuator is supported on a first end of the top plate,
- the piezoactuator that acts in the axial direction, and
- a base plate that is movably guided in the axial direction and on which a second end of the piezoactuator is axially supported and can be actively connected to an actuator of the fuel injection valve.

11. The actuator as claimed in claim 9, wherein the extruded plastics material coating layer covers or forms a connection-side end of the actuator housing unit.

12. The actuator as claimed in claim 9, wherein the opening area of the ventilation opening enlarges discretely at a transition from the actuator housing to the extruded plastics material coating layer.

13. The actuator as claimed in claim 9, wherein at least one sealing ring is arranged in the ventilation opening for annular sealing of a ventilation passage that passes through the center of the ventilation opening and the ventilation element.

14. The actuator as claimed in claim 13, wherein the sealing ring is pressed into the ventilation opening.

15. The actuator as claimed in claim 9, wherein the ventilation element is annularly connected to a cylindrical ventilation element carrier.

16. The actuator as claimed in claim 9, wherein the ventilation element is produced from ePTFE.

17. A method for actuating a fuel injection valve, comprising a piezoactuator which is enclosed in an actuator housing unit having a cylindrical actuator housing which is elongate in an axial direction and at least partially encased by an extruded plastics material coat, wherein the actuator housing unit, in its encased region, is provided with a ventilation aperture in which a ventilation element produced from a microporous material is disposed, the method comprising the step of:
- enlarging the opening area of the ventilation opening via a stepped hole at a transition from the actuator housing to the extruded plastics material coat.

* * * * *